(12) United States Patent
Oh

(10) Patent No.: US 11,177,005 B2
(45) Date of Patent: Nov. 16, 2021

(54) SEMICONDUCTOR MEMORY DEVICE HAVING PLURALITY OF MEMORY CHIPS

(71) Applicant: SK hynix Inc., Icheon-si (KR)

(72) Inventor: Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/926,202

(22) Filed: Jul. 10, 2020

(65) Prior Publication Data

US 2021/0249087 A1    Aug. 12, 2021

(30) Foreign Application Priority Data

Feb. 7, 2020    (KR) ........................ 10-2020-0014798

(51) Int. Cl.
| | |
|---|---|
| *G11C 8/10* | (2006.01) |
| *G11C 8/12* | (2006.01) |
| *G11C 8/00* | (2006.01) |
| *G11C 11/408* | (2006.01) |
| *G11C 8/08* | (2006.01) |
| *G11C 8/06* | (2006.01) |
| *G11C 16/16* | (2006.01) |
| *G11C 16/24* | (2006.01) |
| *G11C 16/08* | (2006.01) |
| *G11C 5/02* | (2006.01) |

(52) U.S. Cl.
CPC .............. *G11C 16/16* (2013.01); *G11C 16/08* (2013.01); *G11C 16/24* (2013.01); *G11C 5/025* (2013.01); *G11C 8/06* (2013.01); *G11C 8/10* (2013.01); *G11C 8/12* (2013.01)

(58) Field of Classification Search
CPC .......... G11C 16/16; G11C 16/08; G11C 16/24
USPC ...................................... 365/230.03
See application file for complete search history.

(56) References Cited

U.S. PATENT DOCUMENTS

| | | | |
|---|---|---|---|
| 7,662,671 B2* | 2/2010 | Saeki ................. | H01L 25/0657 438/114 |
| 2020/0402590 A1* | 12/2020 | Park ................... | G11C 16/0483 |
| 2021/0217480 A1* | 7/2021 | Oh ..................... | G11C 16/14 |

FOREIGN PATENT DOCUMENTS

| | | |
|---|---|---|
| JP | 2018163970 A | 10/2018 |
| KR | 1020180135576 A | 12/2018 |
| KR | 10-2021-0091457 A | 7/2021 |

* cited by examiner

*Primary Examiner* — Ly D Pham

(57) ABSTRACT

A semiconductor memory device includes a plurality of first sub-blocks defined in a first memory chip; and a plurality of second sub-blocks defined in a second memory chip that is stacked on the first memory chip in a stack direction. Each of a plurality of memory blocks includes one of the plurality of first sub-blocks and one of the plurality of second sub-blocks, and wherein an erase voltage is separately applied to the first memory chip and the second memory chip in an erase operation, and the erase operation is performed in a sub-block.

18 Claims, 12 Drawing Sheets

FIG.5

|  |  | DSL/SSL | WL | CSL | BL |
|---|---|---|---|---|---|
| MC1 | BLK1 / SBLK1 (Erase) | 0V→floating | 0V | Verase | Verase |
|  | BLK2-BLKn / SBLK1 (non-Erase) | floating | floating | | |
| MC2 | BLK1 / SBLK2 (non-Erase) | 0V | 0V | 0V | 0V |
|  | BLK2-BLKn / SBLK2 (non-Erase) | 0V | floating | | |

FIG. 9

| | | | DSL/SSL | WL | CSL | BL |
|---|---|---|---|---|---|---|
| Plane1 | MC1 Sub-Plane1 | BLK1 / SBLK1 (Erase) | 0V→floating | 0V | Verase | Verase |
| | | BLK2-BLKn / SBLK1 (non-Erase) | floating | floating | | |
| | MC2 Sub-Plane2 | BLK1 / SBLK2 (non-Erase) | 0V | 0V | 0V | 0V |
| | | BLK2-BLKn / SBLK2 (non-Erase) | 0V | floating | | |
| Plane2 | MC1 Sub-Plane1 | BLK1 / SBLK1 (non-Erase) | 0V | floating | 0V | 0V |
| | | BLK2-BLKn / SBLK1 (non-Erase) | 0V | floating | | |
| | MC2 Sub-Plane2 | BLK1 / SBLK2 (non-Erase) | 0V | floating | 0V | 0V |
| | | BLK2-BLKn / SBLK2 (non-Erase) | 0V | floating | | |

SEMICONDUCTOR MEMORY DEVICE HAVING PLURALITY OF MEMORY CHIPS

CROSS-REFERENCE TO RELATED APPLICATION

The present application claims priority under 35 U.S.C. § 119(a) to Korean Patent Application No. 10-2020-0014798 filed in the Korean Intellectual Property Office on Feb. 7, 2020, which is incorporated herein by reference in its entirety.

BACKGROUND

1. Technical Field

Various embodiments generally relate to semiconductor technology, and particularly, to a semiconductor memory device having a plurality of memory chips.

2. Related Art

As the demand for portable phones, mobile memory devices and digital cameras increases, the demand for non-volatile memory devices, which are mainly used as memory devices for these products, also increases. Among nonvolatile memory devices, a NAND flash memory device is widely used as a data storage device.

In order to achieve a larger capacity and higher performance in a semiconductor memory device, a structure has been proposed in which memory cells of a nonvolatile memory device and a logic circuit for controlling the operation of the memory cells are fabricated on separate chips, and memory chips defined with the memory cells are stacked on a circuit chip defined with the logic circuit.

SUMMARY

Various embodiments are directed to a semiconductor memory device capable of improving memory efficiency.

In an embodiment, a semiconductor memory device may include: a plurality of first sub-blocks defined in a first memory chip; and a plurality of second sub-blocks defined in a second memory chip that is stacked on the first memory chip in a stack direction. Each of a plurality of memory blocks includes one of the plurality of first sub-blocks and one of the plurality of second sub-blocks, and wherein an erase voltage is separately applied to the first memory chip and the second memory chip in an erase operation, and the erase operation is performed in a sub-block.

In an embodiment, a semiconductor memory device may include: a plurality of planes, each defined in a first memory chip and a second memory chip that is stacked on the first memory chip in a stack direction. Each of the plurality of planes includes a first sub-plane that includes a plurality of first sub-blocks disposed in the first memory chip and includes a second sub-plane that includes a plurality of second sub-blocks disposed in the second memory chip. In each of the plurality of planes, each of a plurality of memory blocks includes one of the plurality of first sub-blocks and one of the plurality of second sub-blocks, and wherein an erase voltage is separately applied to each first sub-plane and second sub-plane in an erase operation, and the erase operation is performed in a sub-block.

In an embodiment, a semiconductor memory device may include: a plurality of first sub-blocks defined in a first memory chip including a first erase voltage pass unit; and a plurality of second sub-blocks defined in a second memory chip, including a second erase voltage pass unit, that is stacked on the first memory chip in a stack direction. Each of a plurality of memory blocks includes one of the plurality of first sub-blocks and one of the plurality of second sub-blocks. The first erase voltage pass unit and the second erase voltage pass unit may be coupled in common to a line to receive an erase voltage in an erase operation.

BRIEF DESCRIPTION OF THE DRAWINGS

FIG. 5 is a table illustrating bias conditions in an erase operation of the semiconductor memory device illustrated in FIG. 3.

FIG. 9 is a table illustrating examples of bias conditions in an erase operation of the semiconductor memory device illustrated in FIG. 7.

DETAILED DESCRIPTION

Figure 1:
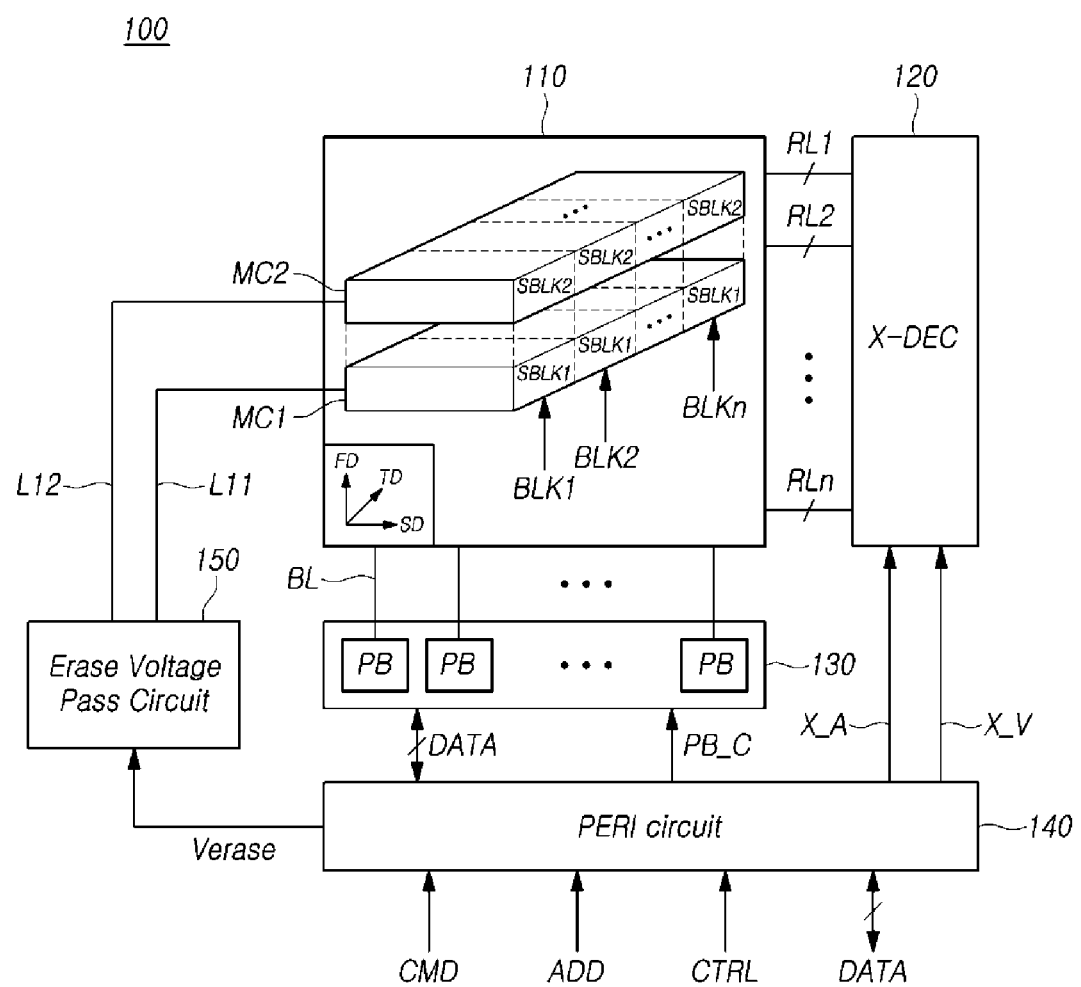
FIG. 1 is a block diagram illustrating a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise. In interpreting elements in embodiments of the disclosure, they should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element Bi" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

In the following descriptions, a direction in which memory chips are stacked is defined as a first direction FD, an arrangement direction of bit lines is defined as a second direction SD, and an extending direction of the bit lines is defined as a third direction TD. The second direction SD and the third direction TD may be parallel to a plane orthogonal to the first direction FD, and may intersect with each other. The second direction SD and the third direction TD may intersect substantially perpendicularly with each other. In the following descriptions, the term 'vertical' or 'vertical direction' will be used as substantially the same meaning as the first direction FD. In the drawings, a direction indicated by an arrow and a direction opposite thereto represent the same direction.

Hereinafter, various examples of embodiments of the disclosure will be described in detail with reference to the accompanying drawings.

FIG. 1 is a block diagram illustrating a semiconductor memory device in accordance with an embodiment of the disclosure.

Referring to FIG. 1, a semiconductor memory device 100 in accordance with an embodiment of the disclosure may include a memory cell array 110 and a logic circuit for controlling the operation of the memory cell array 110. The logic circuit may include a row decoder (X-DEC) 120, a page buffer circuit 130, a peripheral circuit (PERI circuit) 140, and an erase voltage pass circuit 150.

The memory cell array 110 may include a plurality of memory blocks BLK1 to BLKn. Each of the plurality of memory blocks BLK1 to BLKn may include one first sub-block SBLK1 and one second sub-block SBLK2.

The memory cell array 110 may include a plurality of first sub-blocks SBLK1 and a plurality of second sub-blocks SBLK2, which together configure the plurality of memory blocks BLK1 to BLKn. The plurality of first sub-blocks SBLK1 may be disposed in a first memory chip MC1, and the plurality of second sub-blocks SBLK2 may be disposed in a second memory chip MC2. The first memory chip MC1 and the second memory chip MC2 may be stacked in the first direction FD. The first sub-block SBLK1 and the second sub-block SBLK2, which are included in a single memory block (i.e., one of BLK1 to BLKn), may be disposed in the first direction FD. An erase operation of the semiconductor memory device 100 may be performed in the unit of a sub-block.

While not illustrated, each of the first and second sub-blocks SBLK1 and SBLK2 may include a plurality of cell strings. Each cell string may include at least one drain select transistor, a plurality of memory cells and at least one source select transistor, which are coupled in series. While it will be described below that the semiconductor memory device 100 is a vertical NAND flash device, it is to be understood that the technical spirit of the disclosure is not limited thereto.

Each memory block (one of BLK1 to BLKn) may be coupled to the row decoder 120 through a plurality of row lines (e.g., one of RL1 to RLn). For example, the n^th memory block BLKn may be coupled to the row decoder 120 through a plurality of row lines denoted by RLn. The row lines (one of RL1 to RLn) coupled to each memory block (one of BLK1 to BLKn) may include at least one drain select line, a plurality of word lines and at least one source select line.

The row decoder 120 may select any one among the memory blocks BLK1 to BLKn included in the memory cell array 110, in response to a row address X_A provided from the peripheral circuit 140. The row decoder 120 may transfer an operating voltage X_V, provided from the peripheral circuit 140, to the row lines RL1 to RLn.

The memory cell array 110 may be coupled to the page buffer circuit 130 through bit lines BL. The page buffer circuit 130 may include a plurality of page buffers PB that are coupled to the bit lines BL, respectively. The page buffer circuit 130 may receive a page buffer control signal PB_C from the peripheral circuit 140, and may transmit and receive a data signal DATA to and from the peripheral circuit 140. The page buffer circuit 130 may control the bit lines BL, which are arranged in the memory cell array 110, in response to the page buffer control signal PB_C. For example, the page buffer circuit 130 may detect data, stored in a memory cell of the memory cell array 110, by sensing the signal of a bit line BL of the memory cell array 110 in response to the page buffer control signal PB_C, and may transmit the data signal DATA to the peripheral circuit 140 depending on the detected data. The page buffer circuit 130 may apply a signal to a bit line BL based on the data signal DATA received from the peripheral circuit 140 in response to the page buffer control signal PB_C, and thereby, may write data in a memory cell of the memory cell array 110. The page buffer circuit 130 may write data in or read data from memory cells that are coupled to an activated word line.

The peripheral circuit 140 may receive a command signal CMD, an address signal ADD and a control signal CTRL from outside the semiconductor memory device 100, and may transmit and receive data DATA to and from a device outside the semiconductor memory device 100, for example, a memory controller. The peripheral circuit 140 may output signals for writing data in the memory cell array 110 or reading data from the memory cell array 110, for example, the row address X_A, the page buffer control signal PB_C and so forth, based on the command signal CMD, the address signal ADD and the control signal CTRL.

The peripheral circuit 140 may generate various voltages, which are required in the semiconductor memory device 100, by using an external voltage supplied to the semiconductor memory device 100. The peripheral circuit 140 may include a plurality of pumping capacitors, and may generate a plurality of voltages by selectively activating the plurality of pumping capacitors. The plurality of voltages may include the operating voltage X_V and an erase voltage Verase.

The erase voltage pass circuit 150 may be coupled to the first memory chip MC1 and the second memory chip MC2 through lines L11 and L12. In an erase operation, any one of the first sub-blocks SBLK1 of the first memory chip MC1 and the second sub-blocks SBLK2 of the second memory chip MC2 may be selected. The erase voltage pass circuit 150 may transfer the erase voltage Verase to a line (one of L11 and L12) coupled to a memory chip including the sub-block selected in the erase operation, and accordingly, the erase voltage Verase may be applied to the channels of the memory cells of the selected sub-block.

Figure 2:
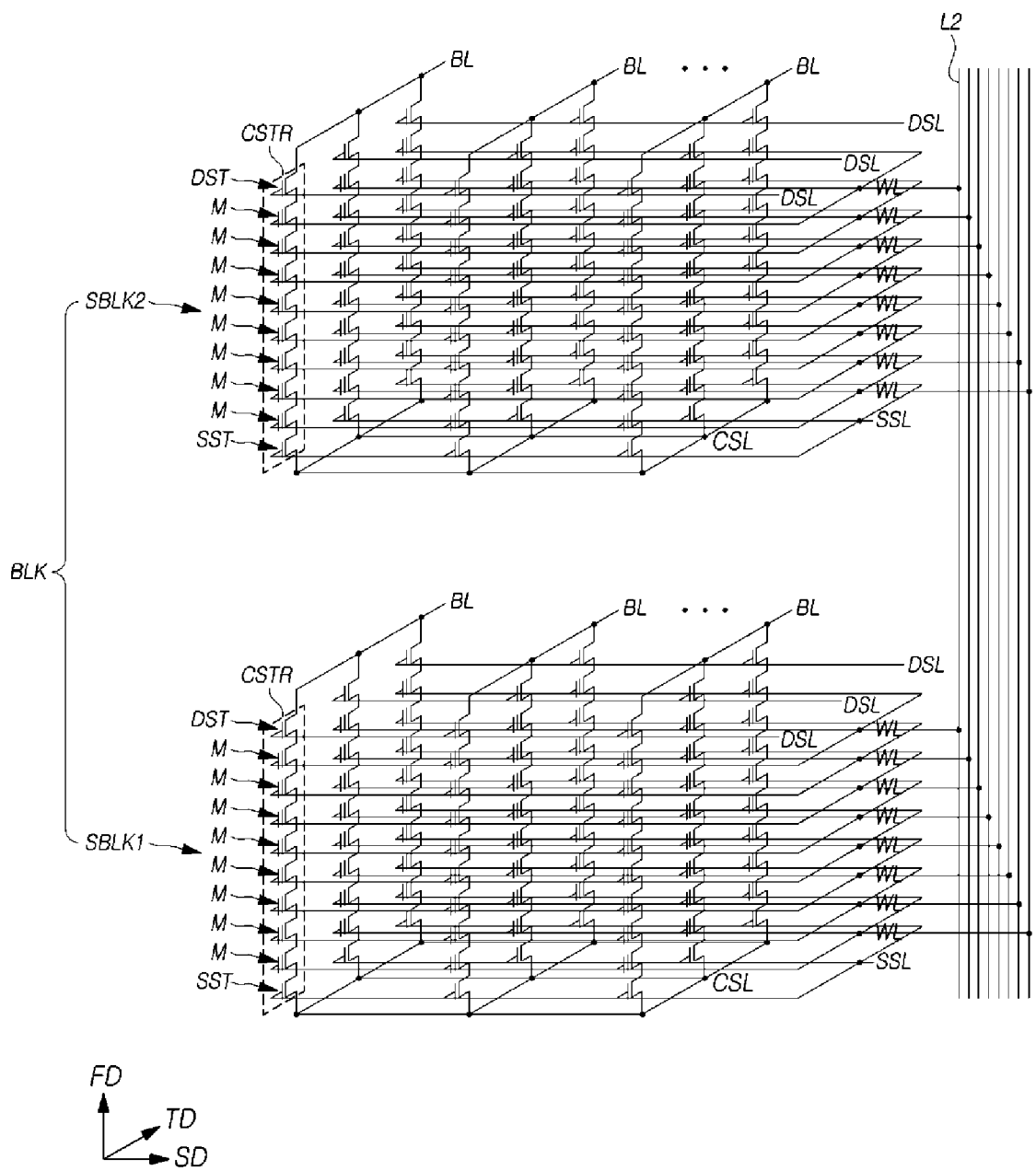
FIG. 2 is an equivalent circuit diagram illustrating a memory block illustrated in FIG. 1.

FIG. 2 is an equivalent circuit diagram illustrating a memory block illustrated in FIG. 1.

Referring to FIG. 2, the memory block BLK may include a first sub-block SBLK1 and a second sub-block SBLK2. The first sub-block SBLK1 and the second sub-block SBLK2, which are included in the memory block BLK, may be disposed in the first direction FD relative to each other.

Each of the first and second sub-blocks SBLK1 and SBLK2 may include a plurality of cell strings CSTR, which are coupled between a plurality of bit lines BL and a common source line CSL. The bit lines BL may extend in the third direction TD and may be arranged in the second direction SD. A plurality of cell strings CSTR may be coupled in parallel to each of the bit lines BL. The cell strings CSTR may be coupled in common to the common source line CSL. The plurality of cell strings CSTR may be coupled between the plurality of bit lines BL and the one common source line CSL.

Each of the cell strings CSTR may include a drain select transistor DST which is coupled to a bit line BL, a source select transistor SST which is coupled to the common source line CSL, and a plurality of memory cells M, which are coupled between the drain select transistor DST and the source select transistor SST. The drain select transistor DST, the memory cells M and the source select transistor SST may be coupled in series in the first direction FD.

A source select line SSL, a plurality of word lines WL and drain select lines DSL may be disposed between the common source line CSL and the bit lines BL in the first direction FD. Each of the drain select lines DSL may be coupled to the gates of corresponding drain select transistors DST. Each of the word lines WL may be coupled to the gates of corresponding memory cells M. The source select line SSL may be coupled to the gates of source select transistors SST.

The word lines WL of the first sub-block SBLK1 and the word lines WL of the second sub-block SBLK2 may correspond to each other on a one to one basis. A word line WL of the first sub-block SBLK1 and a corresponding word line WL of the second sub-block SBLK2 may be coupled in common to one line L2. One of the word lines WL of the first sub-block SBLK1 and one of the word lines WL of the second sub-block SBLK2 may share one line L2, and may be provided with the same operating voltage through the line L2 from the row decoder 120 (see FIG. 1). Memory cells M, coupled to word lines WL of the first and second sub-blocks SBLK1 and SBLK2, which share one line L2, may configure one page. A semiconductor memory device may perform a read operation in units of a page.

While not illustrated, the drain select lines DSL of the first sub-block SBLK1 and the drain select lines DSL of the second sub-block SBLK2 may be coupled to different lines, and may be individually provided with an operating voltage through the different lines from the row decoder 120 (see FIG. 1). The source select line SSL of the first sub-block SBLK1 and the source select line SSL of the second sub-block SBLK2 may be coupled to different lines, and may be individually provided with an operating voltage through the different lines from the row decoder 120 (see FIG. 1).

Figure 3:
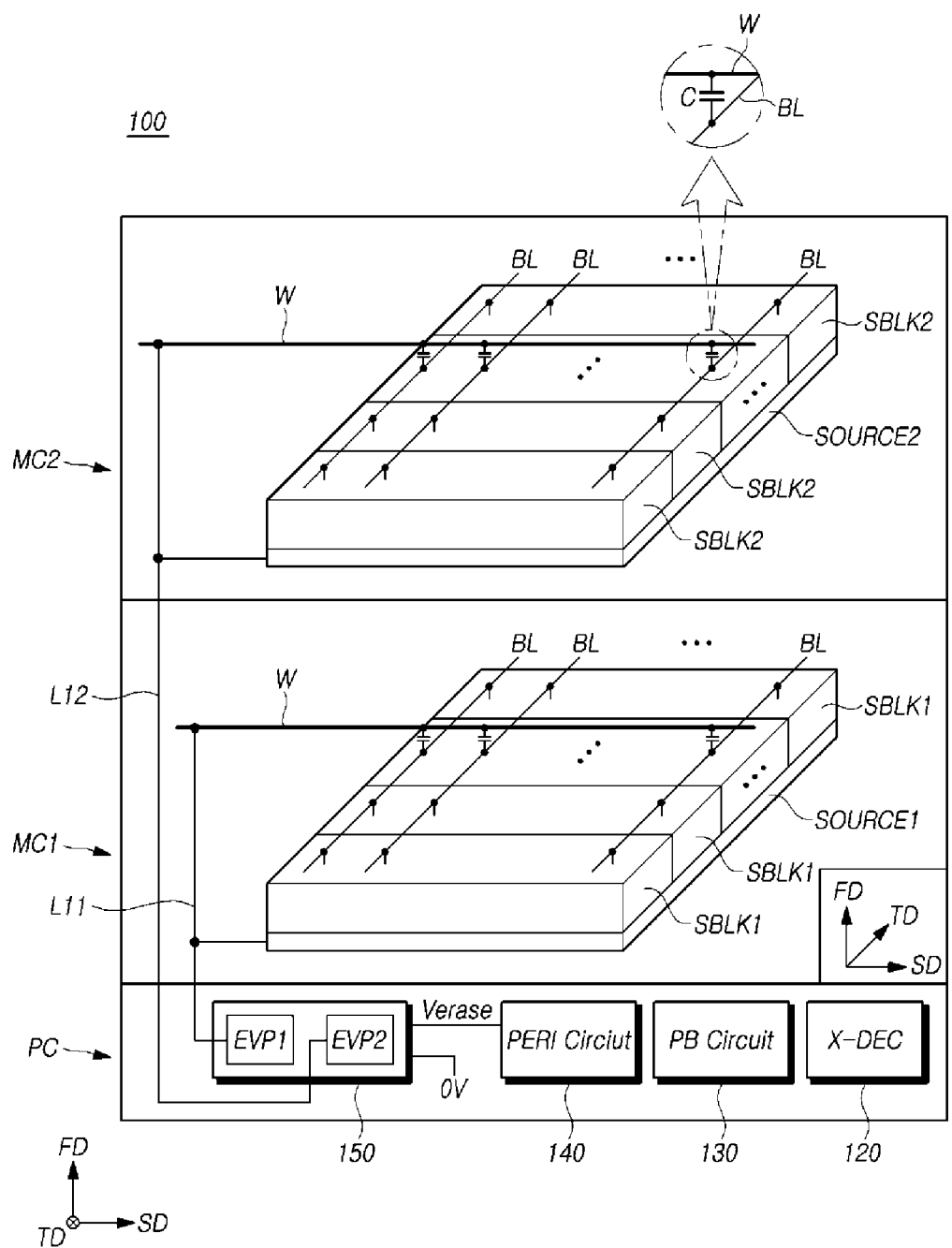
FIG. 3 is a diagram schematically illustrating a configuration of a semiconductor memory device in accordance with an embodiment of the disclosure.

FIG. 3 is a diagram illustrating a configuration of a semiconductor memory device in accordance with an embodiment of the disclosure.

Referring to FIG. 3, a semiconductor memory device 100 in accordance with an embodiment of the disclosure may include a circuit chip PC, and a first memory chip MC1 and a second memory chip MC2, which are stacked on the circuit chip PC in the first direction FD. While the following embodiments illustrate cases in which two memory chips are stacked, it is to be noted that in other embodiments, number of stacked memory chips may be three or more.

The first memory chip MC1 may include a source plate SOURCE1 and a plurality of first sub-blocks SBLK1 which are defined on the source plate SOURCE1. The second memory chip MC2 may include a source plate SOURCE2 and a plurality of second sub-blocks SBLK2 which are defined on the source plate SOURCE2.

The cell strings of the first sub-blocks SBLK1 may be coupled in common to the source plate SOURCE1. The source plate SOURCE1 may configure a common source line of the first sub-blocks SBLK1. The cell strings of the second sub-blocks SBLK2 may be coupled in common to the source plate SOURCE2. The source plate SOURCE2 may configure a common source line of the second sub-blocks SBLK2.

A plurality of bit lines BL may be defined in each of the first and second memory chips MC1 and MC2. The bit lines BL of the first memory chip MC1 may be coupled in common to the plurality of first sub-blocks SBLK1. The bit lines BL of the second memory chip MC2 may be coupled in common to the plurality of second sub-blocks SBLK2.

Each of the first and second memory chips MC1 and MC2 may include a wiring line W that overlaps with the bit lines BL. The wiring line W may be disposed over the bit lines BL. A dielectric layer (not illustrated) may be defined between the wiring line W and the bit lines BL. In an overlapping region between the wiring line W and each bit line BL, a coupling capacitor C including a first electrode which is constituted by the wiring line W, a second electrode which is constituted by the bit line BL and an insulation layer which is constituted by the dielectric layer between the wiring line W and the bit line BL may be configured. Each of the first and second memory chips MC1 and MC2 may include a plurality of coupling capacitors C.

A row decoder 120, a page buffer circuit 130, a peripheral circuit 140 and an erase voltage pass circuit 150, which are described above with reference to FIG. 1, may be disposed in the circuit chip PC.

The erase voltage pass circuit 150 may include a first erase voltage pass unit EVP1 and a second erase voltage pass unit EVP2. The first erase voltage pass unit EVP1 may be coupled to the source plate SOURCE1 and the wiring line W of the first memory chip MC1 through a line L11. The second erase voltage pass unit EVP2 may be coupled to the source plate SOURCE2 and the wiring line W of the second memory chip MC2 through a line L12. While FIG. 3 illustrates the lines L11 and L12 from the viewpoint of electrical connection, the lines L11 and L12 may be actually realized by through-chip vias (TCV) which will be described later with reference to FIG. 10.

If a first sub-block SBLK1 is selected in an erase operation, then the first erase voltage pass unit EVP1 may transfer an erase voltage Verase, provided from the peripheral circuit 140, to the source plate SOURCE1 and the wiring line W of the first memory chip MC1 through the line L11. If all of the first sub-blocks SBLK1 of the first memory chip MC1 are unselected in an erase operation, then the first erase voltage pass unit EVP1 may transfer a ground voltage of 0V to the source plate SOURCE1 and the wiring line W of the first memory chip MC1 through the line L11.

If a second sub-block SBLK2 is selected in an erase operation, then the second erase voltage pass unit EVP2 may transfer the erase voltage Verase, provided from the peripheral circuit 140, to the source plate SOURCE2 and the wiring line W of the second memory chip MC2 through the line L12. If all of the second sub-blocks SBLK2 of the second memory chip MC2 are unselected in an erase operation, then the second erase voltage pass unit EVP2 may transfer the ground voltage of 0V to the source plate SOURCE2 and the wiring line W of the second memory chip MC2 through the line L12.

Figure 4:
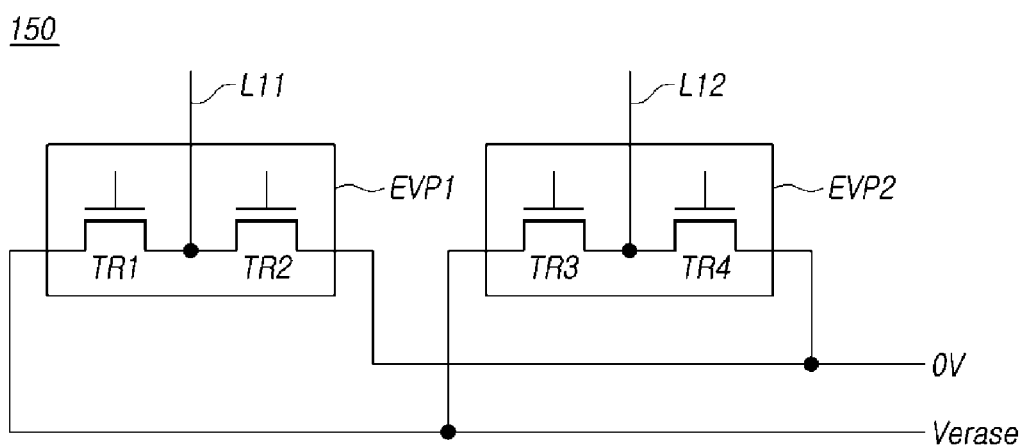
FIG. 4 is a circuit diagram illustrating an erase voltage pass circuit illustrated in FIG. 3.

FIG. 4 is a circuit diagram illustrating an erase voltage pass circuit illustrated in FIG. 3.

Referring to FIG. 4, a first erase voltage pass unit EVP1 may include a first transistor TR1 that is coupled between the erase voltage Verase and the line L11, and a second transistor TR2 that is coupled between the ground voltage of 0V and the line L11. The second erase voltage pass unit EVP2 may include a third transistor TR3 that is coupled between the erase voltage Verase and the line L12, and a fourth transistor TR4 that is coupled between the ground voltage of 0V and the line L12.

If a first sub-block SBLK1 is selected in an erase operation, then the first transistor TR1 may be turned on, and the second transistor TR2 may be turned off. Accordingly, the line L11 may be coupled to the erase voltage Verase, and the erase voltage Verase may be applied to the source plate SOURCE1 and the wiring line W of the first memory chip MC1 (see FIG. 3) through the line L11.

If all of the first sub-blocks SBLK1 are unselected in an erase operation, then the first transistor TR1 may be turned off, and the second transistor TR2 may be turned on. Accordingly, the line L11 may be coupled to the ground voltage of 0V, and the ground voltage of 0V may be applied to the source plate SOURCE1 and the wiring line W of the first memory chip MC1 (see FIG. 3) through the line L11.

If a second sub-block SBLK2 is selected in an erase operation, then the third transistor TR3 may be turned on, and the fourth transistor TR4 may be turned off. Accordingly, the line L12 may be coupled to the erase voltage Verase, and the erase voltage Verase may be applied to the source plate SOURCE2 and the wiring line W of the second memory chip MC2 (see FIG. 3) through the line L12.

If all of the second sub-blocks SBLK2 are unselected in an erase operation, then the third transistor TR3 may be turned off, and the fourth transistor TR4 may be turned on. Accordingly, the line L12 may be coupled to the ground voltage of 0V, and the ground voltage of 0V may be applied to the source plate SOURCE2 and the wiring line W of the second memory chip MC2 (see FIG. 3) through the line L12.

FIG. 5 is a table illustrating examples of bias conditions in an erase operation on a first sub-block SBLK1 of a first memory block BLK1. Hereunder, an erase operation of the semiconductor memory device 100 in accordance with an embodiment of the disclosure will be described with reference to FIGS. 1 to 5.

A Selected First Sub-Block SBLK1 of a First Memory Block BLK1

As a voltage of 0V is applied to the drain select lines DSL and the source select line SSL, the drain select transistors DST and the source select transistors SST are turned off. A voltage of 0V is applied to the word lines WL. The erase voltage Verase is applied to the common source line CSL and the wiring line W. The potentials of the bit lines BL of the first memory chip MC1 follow the voltage applied to the wiring line W and are boosted to the erase voltage Verase by the coupling capacitors C.

As the potentials of the bit lines BL and the common source line CSL rise with the drain select transistors DST and the source select transistors SST turned off, leakage current flows between drains and bulks and thus gate-induced drain leakage (GIDL) current flows in the direction of channels, and hot holes generated in the drain select transistors DST and the source select transistors SST are introduced in the direction of the channels, and thus the potentials of the channels of the cell strings CSTR rise to the level of the erase voltage Verase. Thereafter, the drain select lines DSL and the source select line SSL are floated.

As the potentials of the channels of the cell strings CSTR rise to the level of the erase voltage Verase, the differences between the potentials of the channels and the potentials of 0V of the word lines WL become equal to or larger than a magnitude required for erasing the memory cells M, and then the memory cells M are erased.

Unselected First Sub-Blocks SBLK1 of the Second to n^th Memory Blocks BLK2 to BLKn The drain select lines DSL, the source select lines SSL and the word lines WL are floated. Since the first sub-blocks SBLK1 of the second to n^th memory blocks BLK2 to BLKn share the common source line CSL and the wiring line W with the first sub-block SBLK1 of the first memory block BLK1, the erase voltage Verase is applied to the common source line CSL and the wiring line W. The potentials of the bit lines BL follow the voltage applied to the wiring line W, by the coupling capacitors C, and thereby, are boosted to the erase voltage Verase.

As the potentials of the common source line CSL and the bit lines BL rise, the potentials of the channels of the cell strings CSTR rise following the potentials of the common source lines CSL and the bit lines BL, and the potentials of the word lines WL in the floating state rise following the potentials of the channels, by a coupling phenomenon. Therefore, as the differences in potential between the word lines WL and the channels are maintained to be smaller than the magnitude required for erasing the memory cells M, the memory cells M are not erased.

An Unselected Second Sub-Block SBLK2 of the First Memory Block BLK1

The ground voltage of 0V is applied to the drain select lines DSL and the source select line SSL. Since the word lines WL of the first sub-block SBLK1 and the word lines WL of the second sub-block SBLK2 included in a single memory block are coupled in correspondence to each other, the ground voltage of 0V applied to the word lines WL of the first sub-block SBLK1 of the first memory block BLK1 is also applied to the word lines WL of the second sub-block SBLK2 of the first memory block BLK1. The ground voltage of 0V is applied to the common source line CSL and the wiring line W. The potentials of the bit lines BL follow the voltage applied to the wiring line W, and thereby, are changed to the ground voltage of 0V.

If the potentials of the common source line CSL and the bit lines BL become 0V, the potentials of the channels of the cell strings CSTR also become 0V. Accordingly, since no substantial potential differences exist between the word lines WL and the channels, the memory cells M are not erased.

Unselected Second Sub-Blocks SBLK2 of the Second to nˆth Memory Blocks BLK2 to BLKn The ground voltage of 0V is applied to the drain select lines DSL and the source select lines SSL. Since the word lines WL of the first sub-block SBLK1 and the word lines of the second sub-block SBLK2 included in a single memory block are coupled in correspondence to each other, like the word lines WL of the first sub-blocks SBLK1 of the second to nˆth memory blocks BLK2 to BLKn, the word lines WL of the second sub-blocks SBLK2 of the second to nˆth memory blocks BLK2 to BLKn are also floated.

The ground voltage of 0V is applied to the common source line CSL and the wiring line W. The potentials of the bit lines BL follow the voltage applied to the wiring line W, and thereby, are changed to the ground voltage of 0V.

As the potentials of the common source line CSL and the bit lines BL become 0V, the potentials of the channels of the cell strings CSTR also become 0V. The potentials of the word lines WL in the floating state are changed to 0V following the potentials of the channels, by the coupling phenomenon. Therefore, since there are no substantial potential differences between the word lines WL and the channels, the memory cells M are not erased.

Figure 6:
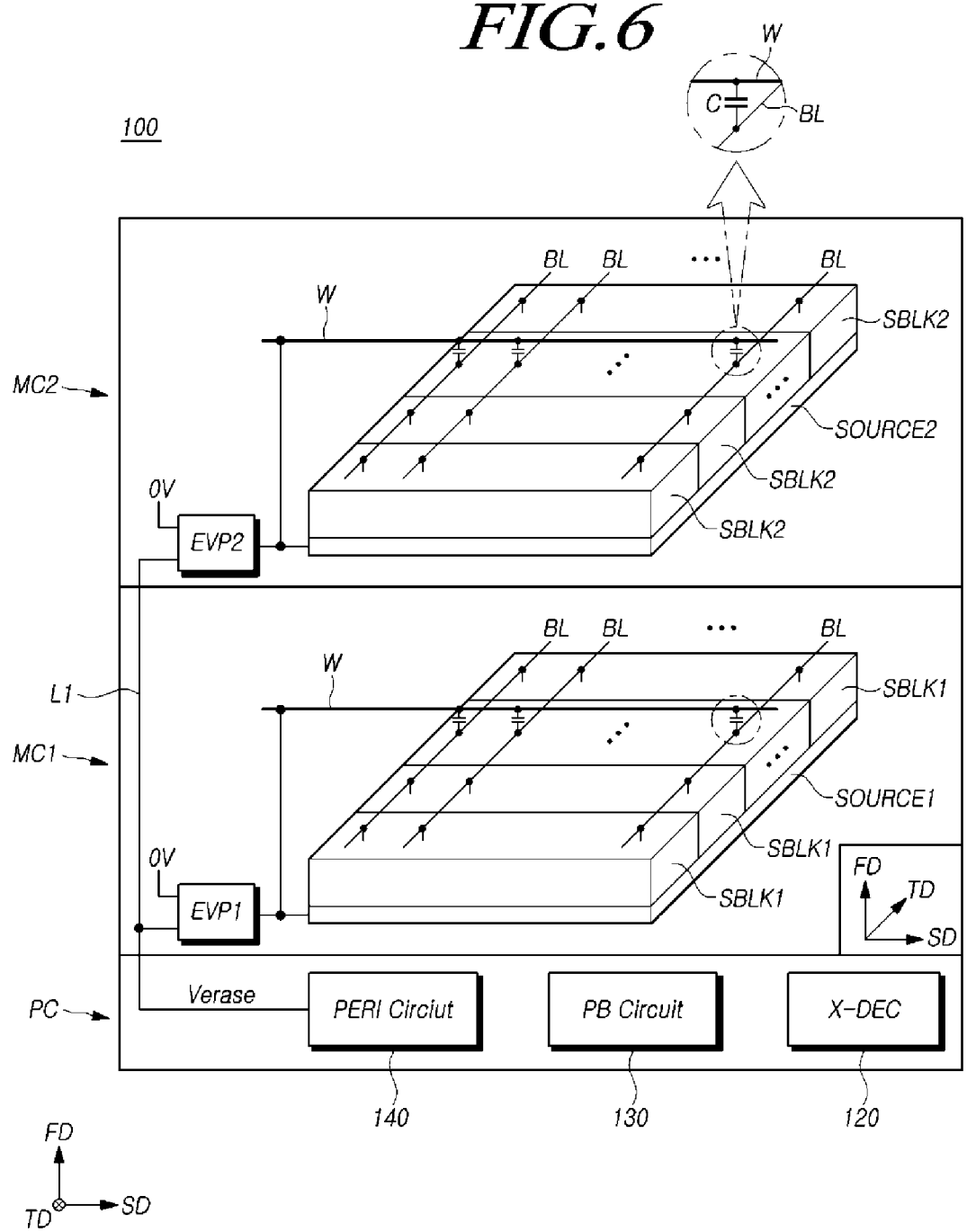
FIG. 6 is a diagram schematically illustrating a semiconductor memory device in accordance with an embodiment of the disclosure.

FIG. 6 is a diagram illustrating a semiconductor memory device in accordance with an embodiment of the disclosure. For the sake of simplicity in explanation, the description of components that are the same as those of FIG. 3 will be omitted herein, and only differences will be described.

Referring to FIG. 6, the first erase voltage pass unit EVP1 may be disposed in the first memory chip MC1, and the second erase voltage pass unit EVP2 may be disposed in the second memory chip MC2. The row decoder 120, the page buffer circuit 130 and the peripheral circuit 140 may be disposed in the circuit chip PC.

The first erase voltage pass unit EVP1 may be coupled to the source plate SOURCE1 and the wiring line W of the first memory chip MC1. The second erase voltage pass unit EVP2 may be coupled to the source plate SOURCE2 and the wiring line W of the second memory chip MC2.

The first erase voltage pass unit EVP1 of the first memory chip MC1 and the second erase voltage pass unit EVP2 of the second memory chip MC2 may be coupled in common to one line L1, and may be coupled to the peripheral circuit 140 of the circuit chip PC through the line L1 to receive the erase voltage Verase from the peripheral circuit 140. While FIG. 6 illustrates the line L1 from the viewpoint of electrical connection, the line L1 may be realized in the form of through-chip vias (TCV) which will be described later with reference to FIG. 10.

When a first sub-block SBLK1 is selected in an erase operation, the first erase voltage pass unit EVP1 may transfer the erase voltage Verase, provided through the line L1 from the peripheral circuit 140, to the source plate SOURCE1 and the wiring line W of the first memory chip MC1. If all of the first sub-blocks SBLK1 are unselected in an erase operation, then the first erase voltage pass unit EVP1 may transfer the ground voltage of 0V to the source plate SOURCE1 and the wiring line W of the first memory chip MC1.

When a second sub-block SBLK2 is selected in an erase operation, the second erase voltage pass unit EVP2 may transfer the erase voltage Verase, provided through the line L1 from the peripheral circuit 140, to the source plate SOURCE2 and the wiring line W of the second memory chip MC2. If all of the second sub-blocks SBLK2 are unselected in an erase operation, then the second erase voltage pass unit EVP2 may transfer the ground voltage of 0V to the source plate SOURCE2 and the wiring line W of the second memory chip MC2.

As described above, the line L1 may be configured by through-chip vias (TCV) which will be described later with reference to FIG. 10. If the number of through-chip vias (TCV) increases, then manufacturing costs may increase, and the size of the semiconductor memory device 100 may increase. According to embodiments disclosed herein, because the first erase voltage pass unit EVP1 of the first memory chip MC1 and the second erase voltage pass unit EVP2 of the second memory chip MC2 share the one line L1, it is possible to reduce the number of through-chip vias (TCV). Therefore, it is possible to reduce manufacturing costs, and it is possible to contribute to reducing the size of the semiconductor memory device 100.

Figure 7:
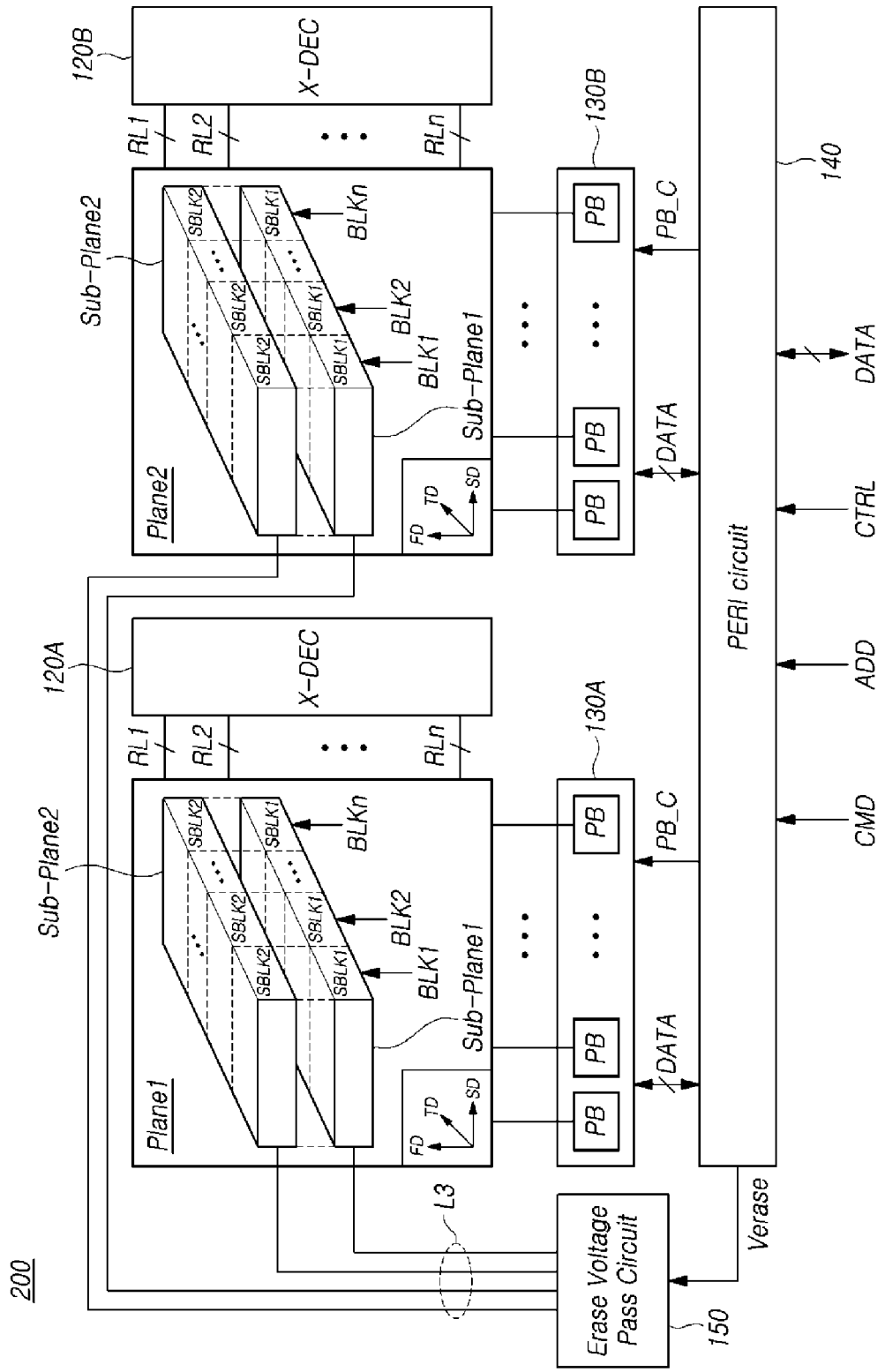
FIG. 7 is a diagram schematically illustrating a semiconductor memory device in accordance with an embodiment of the disclosure.
Figure 8:
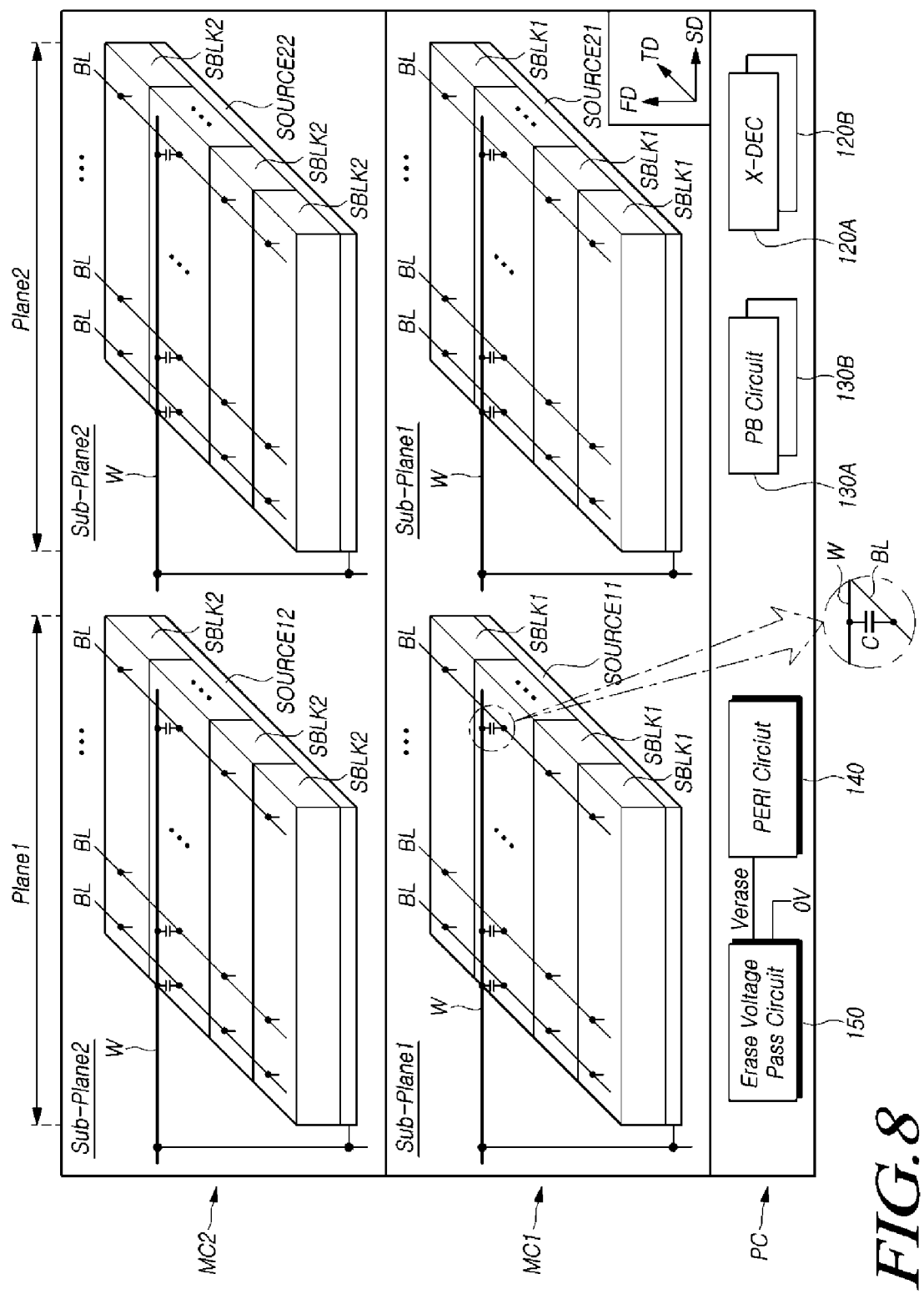
FIG. 8 is a diagram schematically illustrating a configuration of the semiconductor memory device illustrated in FIG. 7.

FIG. 7 is a diagram schematically illustrating a semiconductor memory device in accordance with an embodiment of the disclosure, and FIG. 8 is a diagram schematically illustrating a configuration of the semiconductor memory device illustrated in FIG. 7. For the sake of simplicity in explanation, descriptions for components that are the same as those of in embodiments described above with reference to FIGS. 1 to 6 will be omitted, and only differences will be described hereunder.

Referring to FIG. 7, a semiconductor memory device 200 may include a plurality of planes Plane1 and Plane2. The semiconductor memory device 200 may have a multi-plane structure. FIG. 7 illustrates a two-plane structure, but embodiments are not limited in the number of planes. For the sake of convenience in explanation, the planes Plane1 and Plane2 will be defined as a first plane Plane1 and a second plane Plane2.

Each of the first and second planes Plane1 and Plane2 may include a first sub-plane Sub-Plane1 and a second sub-plane Sub-Plane2. The first sub-plane Sub-Plane1 of the first plane Plane1 and the first sub-plane Sub-Plane1 of the second plane Plane2 may be disposed in a first memory chip. The second sub-plane Sub-Plane2 of the first plane Plane1 and the second sub-plane Sub-Plane2 of the second plane Plane2 may be disposed in a second memory chip.

Each of the first sub-plane Sub-Plane1 of the first plane Plane1 and the first sub-plane Sub-Plane1 of the second plane Plane2 may include a plurality of first sub-blocks SBLK1. Each of the second sub-plane Sub-Plane2 of the first plane Plane1 and the second sub-plane Sub-Plane2 of the second plane Plane2 may include a plurality of second sub-blocks SBLK2.

Each of the first plane Plane1 and the second plane Plane2 may include a plurality of memory blocks BLK1 to BLKn. Each of the memory blocks BLK1 to BLKn may include one first sub-block SBLK1 and one second sub-block SBLK2. The first sub-block SBLK1 and the second sub-block SBLK2, which are included in a single memory block (one of BLK1 to BLKn), may be disposed in the first direction FD relative to each other.

As described above with reference to FIG. 2, word lines WL of first and second sub-blocks SBLK1 and SBLK2 included in a single memory block may correspond to each other one by one, and each word line WL of the first sub-block SBLK1 and each word line WL of the second sub-block SBLK2 that correspond to each other may be coupled in common to one line L2 (see in FIG. 2). One of the word lines WL of the first sub-block SBLK1 and one of the word lines WL of the second sub-block SBLK2 may share one line L2, and may be provided with an operating voltage through the line L2 from a row decoder (one of 120A and 120B).

Referring back to FIG. 7, Drain select lines DSL of the first and second sub-blocks SBLK1 and SBLK2 that are included in a single memory block BLK may be coupled to different lines, and may be individually provided with an operating voltage through the different lines from the row decoder (one of 120A and 120B). Source select lines SSL of the first and second sub-blocks SBLK1 and SBLK2 included in a single memory block BLK may be coupled to different lines, and may be individually provided with an operating voltage through the different lines from the row decoder (one of 120A and 120B).

A row decoder and a page buffer circuit may be provided individually for each plane. In an embodiment, the semiconductor memory device 200 may include two row decoders 120A and 120B that correspond respectively to the first and second planes Plane1 and Plane2, and two page buffer circuits 130A and 130B that respectively correspond to the first and second planes Plane1 and Plane2.

A peripheral circuit 140 and an erase voltage pass circuit 150 may be provided in common for the first and second planes Plane1 and Plane2. The first plane Plane1 and the second plane Plane2 may share one peripheral circuit 140, and may share one erase voltage pass circuit 150.

Referring to FIG. 8, a first memory chip MC1 may include a source plate SOURCE11 corresponding to the first sub-plane Sub-Plane1 of the first plane Plane1 and a source plate SOURCE21 corresponding to the first sub-plane Sub-Plane1 of the second plane Plane2. The plurality of first sub-blocks SBLK1 may be defined on each source plate (SOURCE11 and SOURCE21) of the first memory chip MC1.

A second memory chip MC2 may include a source plate SOURCE12 corresponding to the second sub-plane Sub-Plane2 of the first plane Plane1 and a source plate SOURCE22 corresponding to the second sub-plane Sub-Plane2 of the second plane Plane2. The plurality of second sub-blocks SBLK2 may be defined on each source plate (SOURCE12 and SOURCE22) of the second memory chip MC2.

The source plate SOURCE11 corresponding to the first sub-plane Sub-Plane1 of the first plane Plane1 and the source plate SOURCE12 corresponding to the second sub-plane Sub-Plane2 of the first plane Plane1 may be arranged in the first direction FD. The source plate SOURCE21 corresponding to the first sub-plane Sub-Plane1 of the second plane Plane2 and the source plate SOURCE22 corresponding to the second sub-plane Sub-Plane2 of the second plane Plane2 may be arranged in the first direction FD.

The first plane Plane1 may include the plurality of first sub-blocks SBLK1 defined on the source plate SOURCE11 and the plurality of second sub-blocks SBLK2 defined on the source plate SOURCE12. The second plane Plane2 may include the plurality of first sub-blocks SBLK1 defined on the source plate SOURCE21 and the plurality of second sub-blocks SBLK2 defined on the source plate SOURCE22.

A plurality of bit lines BL may be defined in each of the first and second memory chips MC1 and MC2. The sub-blocks included in the same sub-plane may share bit lines BL. The sub-blocks included in different sub-planes do not share bit lines BL.

Each of the first and second memory chips MC1 and MC2 may include a plurality of wiring lines W that overlap with bit lines BL. Each wiring line W may be disposed over bit lines BL.

A wiring line W may be individually provided for each sub-plane. For example, two wiring lines W, corresponding respectively to the first sub-plane Sub-Plane1 of the first plane Plane1 and the first sub-plane Sub-Plane1 of the second plane Plane2, may be defined in the first memory chip MC1. Two wiring lines W corresponding to the second sub-plane Sub-Plane1 of the first plane Plane1 and the second sub-plane Sub-Plane1 of the second plane Plane1, respectively, may be defined in the second memory chip MC2.

Each of the wiring lines W overlaps with and couples to the bit lines BL coupled to a corresponding sub-plane, and does not couple to the bit lines BL coupled to other sub-planes.

A dielectric layer (not illustrated) may be disposed between each wiring line W and the bit lines BL. In an overlapping region between the wiring line W and each coupled bit line BL, a coupling capacitor C including a first electrode that is constituted by the wiring line W, a second electrode that is constituted by the bit line BL and an insulation layer that is constituted by the dielectric layer between the wiring line W and the bit line BL may be configured.

The row decoders 120A and 120B, the page buffer circuits 130A and 130B, the peripheral circuit 140 and the erase voltage pass circuit 150 may be disposed in the circuit chip PC.

A source plate and a wiring line that are included in the same sub-plane may be electrically coupled to each other, and may be provided with the same voltage from the erase voltage pass circuit 150. Source plates and wiring lines that are disposed in different sub-planes may be electrically decoupled from each other.

In an erase operation, an erase voltage may be applied to a source plate and bit lines of a sub-plane. The erase voltage may be provided independently for each sub-plane such that the erase operation is performed in units of a sub-block.

FIG. 9 is a table illustrating examples of bias conditions in an erase operation, of the semiconductor memory device illustrated in FIG. 7, performed on the first sub-block SBLK1 of the first memory block BLK1 included in the first plane Plane1. Hereunder, an erase operation of the semiconductor memory device 200 in accordance with an embodiment of the disclosure will be described with reference to FIGS. 7 to 9.

A Selected First Sub-Block SBLK1 of a First Memory Block BLK1 of the First Plane Plane1

As a voltage of 0V is applied to the drain select lines DSL and the source select line SSL, the drain select transistors DST and the source select transistors SST are turned off. A voltage of 0V is applied to the word lines WL. The erase voltage Verase is applied to the common source line CSL and the wiring line W. The potentials of the bit lines BL follow the voltage applied to the wiring line W, by the coupling capacitors C, and thereby, are boosted to the erase voltage Verase.

As the potentials of the bit lines BL and the common source line CSL rise with the drain select transistors DST and the source select transistors SST turned off, leakage current flows between drains and bulks and thus gate-induced drain leakage (GIDL) current flows in the direction of channels, and hot holes generated in the drain select transistors DST and the source select transistors SST are introduced in the direction of the channels, and thus the potentials of the channels of the cell strings CSTR rise. Thereafter, the drain select lines DSL and the source select line SSL are floated.

As the potentials of the channels of the cell strings CSTR rise to the level of the erase voltage Verase, the differences between the potentials of the channels and the potentials of 0V of the word lines WL become equal to or larger than a magnitude required for erasing the memory cells M, and then the memory cells M are erased.

Unselected First Sub-Blocks SBLK1 of the Second to nˆth Memory Blocks BLK2 to BLKn of the First Plane Plane1

The drain select lines DSL, the source select lines SSL and the word lines WL are floated. Since the first sub-blocks SBLK1 of the second to nˆth memory blocks BLK2 to BLKn of the first plane Plane1 share the common source line CSL and the wiring line W with the first sub-block SBLK1 of the first memory block BLK1 of the first plane Plane1, all of which belong to the same sub-plane Sub-Plane1 of first plane Plane1, the erase voltage Verase is applied to the common source line CSL and the wiring line W. The potentials of the bit lines BL follow the voltage applied to the wiring line W, by the coupling capacitors C, and thereby, are boosted to the erase voltage Verase.

As the potentials of the common source line CSL and the bit lines BL rise, the potentials of the channels of the cell strings CSTR rise following the potentials of the common source lines CSL and the bit lines BL, and the potentials of the word lines WL in the floating state rise following the potentials of the channels, by a coupling phenomenon. Therefore, as the differences in potential between the word lines WL and the channels are maintained to be smaller than the magnitude required for erasing the memory cells M, the memory cells M are not erased.

An Unselected Second Sub-Block SBLK2 of the First Memory Block BLK1 of the First Plane Plane1

The ground voltage of 0V is applied to the drain select lines DSL and the source select line SSL. Since the word lines WL of the first sub-block SBLK1 and the word lines WL of the second sub-block SBLK2 included in a single memory block are coupled in correspondence to each other, the ground voltage of 0V applied to the word lines WL of the first sub-block SBLK1 of the first memory block BLK1 of the first plane Plane1 is also applied to the word lines WL of the second sub-block SBLK2 of the first memory block BLK1 of the first plane Plane1. The ground voltage of 0V is applied to the common source line CSL and the wiring line W. The potentials of the bit lines BL follow the voltage applied to the wiring line W, and thereby, are changed to the ground voltage of 0V.

If the potentials of the common source line CSL and the bit lines BL become 0V, the potentials of the channels of the cell strings CSTR also become 0V. Accordingly, since there are no substantial potential differences between the word lines WL and the channels, the memory cells M are not erased.

Unselected Second Sub-Blocks SBLK2 of the Second to nˆth Memory Blocks BLK2 to BLKn of the First Plane Plane1

The ground voltage of 0V is applied to the drain select lines DSL and the source select line SSL. Since the word lines WL of the first sub-block SBLK1 and the word lines WL of the second sub-block SBLK2 included in a single memory block are coupled in correspondence to each other, like the word lines WL of the first sub-blocks SBLK1 of the second to nˆth memory blocks BLK2 to BLKn, the word lines WL of the second sub-blocks SBLK2 of the second to nˆth memory blocks BLK2 to BLKn are also floated.

The ground voltage of 0V is applied to the common source line CSL and the wiring line W. The potentials of the bit lines BL follow the voltage applied to the wiring line W, and thereby, are changed to the ground voltage of 0V.

As the potentials of the common source line CSL and the bit lines BL become 0V, the potentials of the channels of the cell strings CSTR also become 0V. The potentials of the word lines WL in the floating state are changed to 0V following the potentials of the channels, by the coupling phenomenon. Therefore, since there are no substantial potential differences between the word lines WL and the channels, the memory cells M are not erased.

First and Second Sub-Blocks SBLK1 and SBLK2 of the First to nˆth Memory Blocks BLK1 to BLKn of the Second Plane Plane2

The ground voltage of 0V is applied to the drain select lines DSL and the source select lines SSL. The word lines WL are floated. The ground voltage of 0V is applied to the common source lines CSL and the wiring lines W. The potentials of the bit lines BL follow the voltage applied to the wiring lines W, and thereby, are changed to the ground voltage of 0V.

As the potentials of the common source lines CSL and the bit lines BL become 0V, the potentials of the channels of the cell strings CSTR also become 0V. The potentials of the word lines WL in the floating state are changed to 0V following the potentials of the channels, by the coupling phenomenon. Therefore, since there are no substantial potential differences between the word lines WL and the channels, the memory cells M are not erased.

Figure 10:
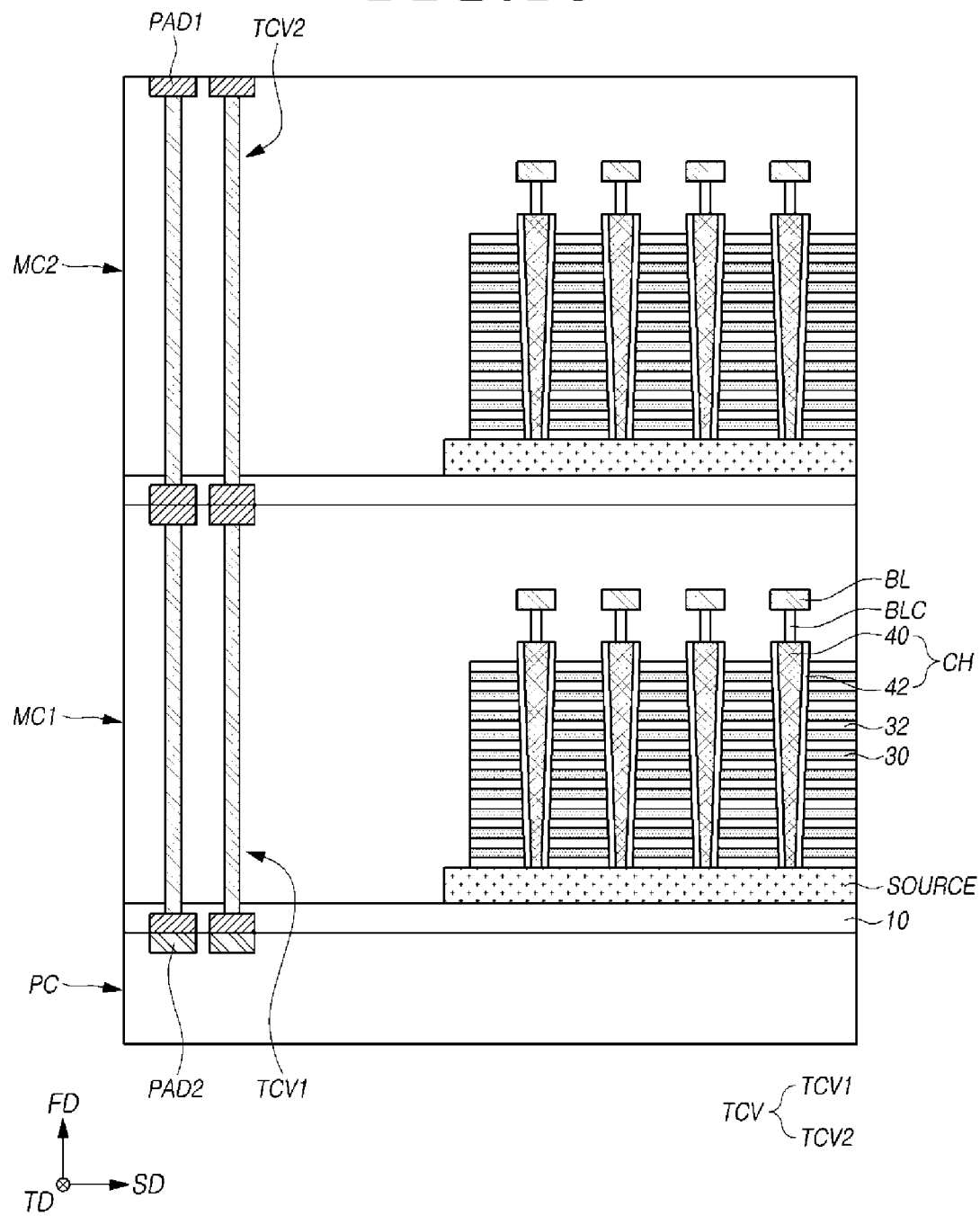
FIG. 10 is a cross-sectional view schematically illustrating a semiconductor memory device in accordance with an embodiment of the disclosure.

FIG. 10 is a cross-sectional view schematically illustrating a semiconductor memory device in accordance with an embodiment of the disclosure.

Referring to FIG. 10, each of first and second memory chips MC1 and MC2 may include a plurality of electrode layers 30 and a plurality of interlayer dielectric layers 32 that are alternately stacked on a source plate SOURCE, and a plurality of vertical channels CH that pass through the plurality of electrode layers 30 and the plurality of interlayer dielectric layers 32.

The source plate SOURCE may be disposed on a base layer 10. The base layer 10 may be formed of a dielectric material. The source plate SOURCE may be formed of polysilicon.

The electrode layers 30 may include a conductive material. For example, the electrode layers 30 may include at least one selected among a doped semiconductor (e.g., doped silicon), a metal (e.g., tungsten, copper or aluminum), conductive metal nitride (e.g., titanium nitride or tantalum nitride) and a transition metal (e.g., titanium or tantalum). The interlayer dielectric layers 32 may include silicon oxide. At least one layer from the lowermost layer among the electrode layers 30 may configure a source select line. At least one layer from the uppermost layer among the electrode layers 30 may configure a drain select line. The electrode layers 30 between the source select line and the drain select line may configure word lines.

The vertical channels CH may be coupled to the source plate SOURCE by passing through the electrode layers 30 and the interlayer dielectric layers 32. Each of the vertical channels CH may include a channel layer 40 and a gate dielectric layer 42. The channel layer 40 may include polysilicon or monocrystalline silicon, and may include a P-type impurity such as boron (B) in some regions thereof. The gate dielectric layer 42 may have the shape of a straw or a cylindrical shell which surrounds the outer wall of the channel layer 40. The gate dielectric layer 42 may include a tunnel dielectric layer, a charge storage layer and a blocking layer which are sequentially stacked from the outer sidewall of the channel layer 40. In some embodiments, the gate dielectric layer 42 may have an ONO (oxide-nitride-oxide) stack structure in which an oxide layer, a nitride layer and an oxide layer are sequentially stacked. Source select transistors may be configured in areas where the source select line surrounds the vertical channels CH. Memory cells may be configured in areas where the word lines surround the vertical channels CH. Drain select transistors may be configured in areas where the drain select line surrounds the vertical channels CH.

A plurality of bit lines BL may be disposed over the vertical channels CH and the alternately stacked electrode layers 30 and the interlayer dielectric layers 32. Bit line contacts BLC may be defined under the bit lines BL to couple the bit lines BL and the vertical channels CH.

First through-chip vias TCV1 which traverse the first memory chip MC1 in the first direction FD may be defined. The top end of each of the first through-chip vias TCV1 may be exposed on the top surface of the first memory chip MC1, and the bottom end of each of the first through-chip vias TCV1 may be exposed on the bottom surface of the first memory chip MC1.

Second through-chip vias TCV2 which traverse the second memory chip MC2 in the first direction FD may be defined. The top end of each of the second through-chip vias TCV2 may be exposed on the top surface of the second memory chip MC2, and the bottom end of each of the second through-chip vias TCV2 may be exposed on the bottom surface of the second memory chip MC2. The top and bottom ends of the first and second through-chip vias TCV1 and TCV2 may be configured by pads PAD1.

The pads PAD1 configuring the bottom ends of the first through-chip vias TCV1 may be bonded to pads PAD2 of a circuit chip PC. The pads PAD1 configuring the bottom ends of the second through-chip vias TCV2 may be bonded to the pads PAD1 configuring the top ends of the first through-chip vias TCV1. The first through-chip vias TCV1 and the second through-chip vias TCV2 that are disposed in a line in the first direction FD may configure through-chip vias TCV. The through-chip vias TCV may provide routing paths that traverse the first and second memory chips MC1 and MC2 in the first direction FD. A plurality of through-chip vias TCV may be formed in the first and second memory chips MC1 and MC2, and such through-chip vias may configure lines such as line L1, line L2 and line L3 in embodiments of this disclosure.

Hereunder, effects according to embodiments of the disclosure will be described.

In order to improve the degree of integration, a method of increasing the number of memory cells included in unit cell string may be used. However, if the number of memory cells included in unit cell string is increased, the number of word lines is also increased in correspondence to the increased number of the memory cells. Accordingly, as the number of pass transistors which provide driving signals to word lines is increased, the area of a row decoder also increases. In addition, because the number of through-chip vias (TCV of FIG. 10) that couple the word lines and the row decoder also increases in correspondence to an increased number of word lines, manufacturing costs may increase, and the size of a semiconductor memory device may increase.

As a method for improving the degree of integration and preventing the occurrence of the above-described problems, a method of increasing the number of cell strings included in memory block units may be used. In order to improve the memory efficiency of a nonvolatile memory device, it is necessary to shorten a time required to rewrite data after erasing data stored in a memory block. However, if the number of cell strings included in unit memory block is increased, then the time required to perform an erase operation lengthens such that memory operations and efficiency may be degraded.

If the size of a memory block is reduced, then an erase time may be reduced, and thereby, memory efficiency may be improved. However, in this case, as the number of memory blocks increases, the number of pass transistors of a row decoder increases, and the number of through chip vias (TCV of FIG. 10) increases, which may increase manufacturing costs and may increase the size of a semiconductor memory device.

In embodiments disclosed herein, by placing sub-blocks of a memory block in different memory chips, and by applying an erase voltage independently to each memory chip in an erase operation, erase operations may be performed in units of a sub-block. The improved configurations and schemes for erase operations in sub-blocks enable a reduction in the size of erase unit without increasing the number of memory blocks. Accordingly, it is possible to improve memory efficiency by quickly and efficiently erasing data, and in particular smaller sized of data, without the difficulties associated with increasing the number of pass transistors of a row decoder and the number of through-chip vias coupling the pass transistors and word lines.

Figure 11:
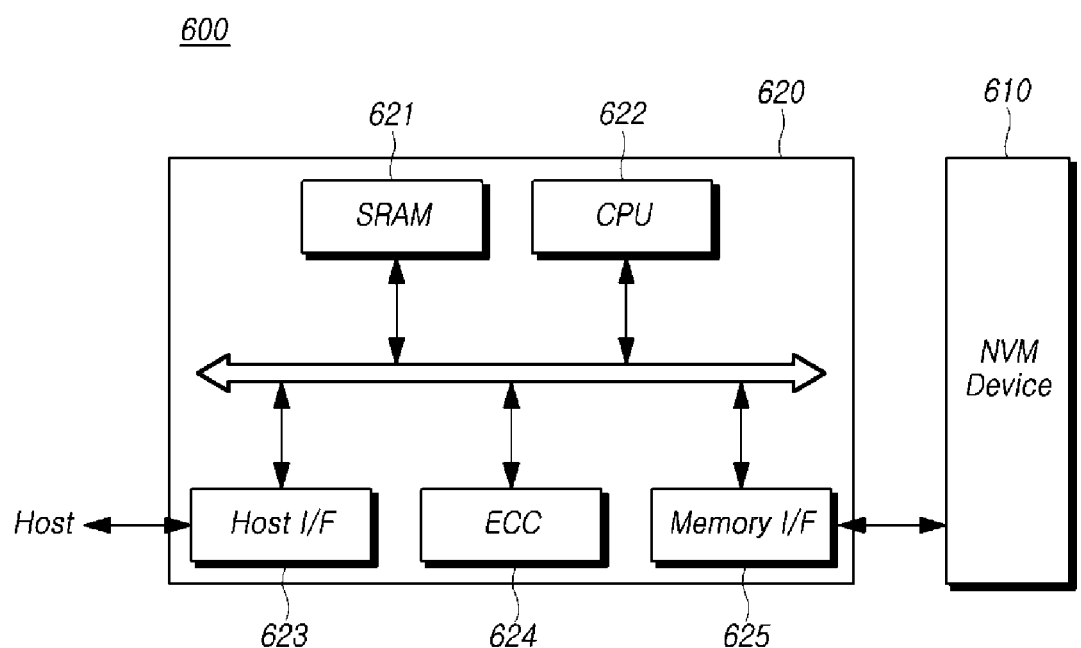
FIG. 11 is a block diagram schematically illustrating a memory system including a semiconductor memory device in accordance with an embodiment of the disclosure.

FIG. 11 is a block diagram schematically illustrating a memory system including a semiconductor memory device in accordance with an embodiment.

Referring to FIG. 11, a memory system 600 in accordance with an embodiment may include a nonvolatile memory device (NVM Device) 610 and a memory controller 620.

The nonvolatile memory device 610 may be constituted by the semiconductor memory device described above and may operate in the manner described above. The memory controller 620 may be configured to control the nonvolatile memory device 610. By the combination of the nonvolatile memory device 610 and the memory controller 620, a memory card or a solid state disk (SSD) may be provided. An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device 610.

A memory interface (Memory I/F) 625 interfaces with the nonvolatile memory device 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 12:
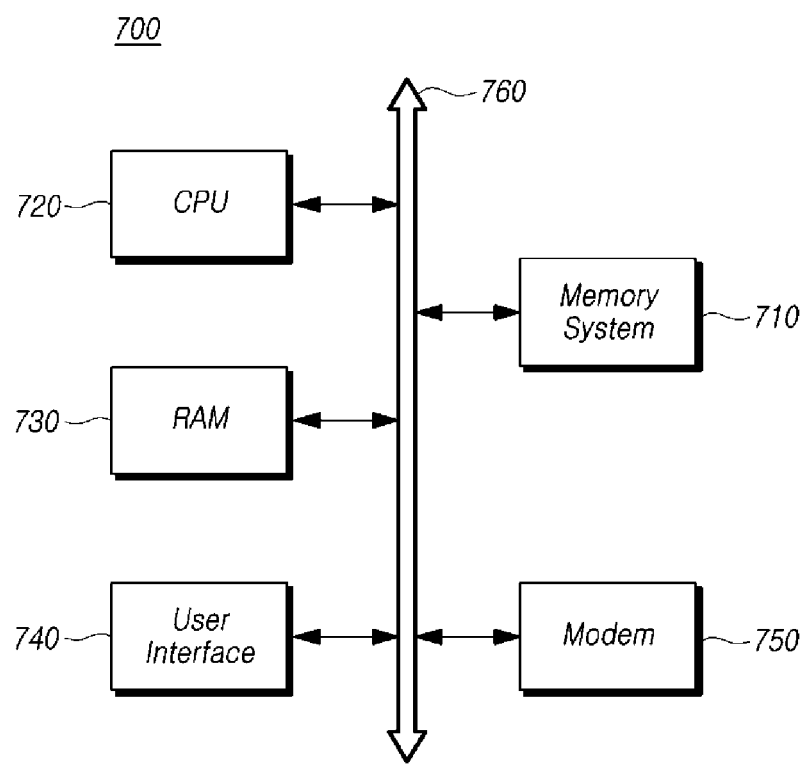
FIG. 12 is a block diagram schematically illustrating a computing system including a semiconductor memory device in accordance with an embodiment of the disclosure.

FIG. 12 is a block diagram schematically illustrating a computing system including a semiconductor memory device in accordance with an embodiment.

Referring to FIG. 12, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A semiconductor memory device comprising:
   a plurality of first sub-blocks defined in a first memory chip; and
   a plurality of second sub-blocks defined in a second memory chip that is stacked on the first memory chip in a stack direction,
   wherein each of a plurality of memory blocks includes one of the plurality of first sub-blocks and one of the plurality of second sub-blocks,
   wherein an erase voltage is separately applied to the first memory chip and the second memory chip in an erase operation, and the erase operation is performed in a sub-block, and
   wherein the erase voltage is provided to a source plate and bit lines of the first memory chip or the second memory chip that includes a selected sub-block, and a ground voltage is provided to a source plate and bit lines of the first memory chip or the second memory chip that does not include the selected sub-block.

2. The semiconductor memory device according to claim 1, wherein a first sub-block and a second sub-block that configure a memory block are spaced apart in the stack direction.

3. The semiconductor memory device according to claim 1,
   wherein each of the first and second memory chips includes a coupling capacitor comprising a first electrode configured by a bit line, a second electrode configured by a wiring line and overlapping with the bit line, and an insulation layer configured by a dielectric layer and disposed between the bit line and the wiring line, and
   wherein, in the erase operation, the erase voltage is applied to the wiring line of the first memory chip or the second memory chip that includes a selected sub-block, and is provided to the bit line of the first memory chip or the second memory chip in which the selected sub-block is included.

4. The semiconductor memory device according to claim 3, further comprising:
   a logic circuit defined on a circuit chip that is stacked together with the first and second memory chips,
   wherein the logic circuit comprises:
   a first erase voltage pass unit that transfers the erase voltage to the source plate and the wiring line of the first memory chip when one of the plurality of first sub-blocks is selected; and
   a second erase voltage pass unit that transfers the erase voltage to the source plate and the wiring line of the second memory chip when one of the plurality of second sub-blocks is selected, and
   wherein the first erase voltage pass unit and the second erase voltage pass unit operate independently of each other.

5. The semiconductor memory device according to claim 4,
   wherein the first erase voltage pass unit transfers the erase voltage to the source plate and the wiring line of the first memory chip through a via that traverses the first memory chip in the stack direction, and
   wherein the second erase voltage pass transfers the erase voltage to the source plate and the wiring line of the second memory chip through a via that traverses the second memory chip in the stack direction.

6. The semiconductor memory device according to claim 4,
   wherein each of the first and second memory chips further includes an erase voltage pass unit that is coupled in common to the source plate and the wiring line and that transfers the erase voltage to the source plate and the wiring line in the erase operation, and
   wherein the erase voltage pass unit of the first memory chip and the erase voltage pass unit of the second memory chip operate independently of each other.

7. The semiconductor memory device according to claim 1,
   wherein each of the plurality of first sub-blocks and each of the plurality of second sub-blocks includes a plurality of cell strings, and
   wherein each of the plurality of cell strings comprises:

a drain select transistor coupled to a bit line;
a source select transistor coupled to a source plate; and
a plurality of memory cells coupled between the drain select transistor and the source select transistor.

8. The semiconductor memory device according to claim 7, further comprising:
a logic circuit defined on a circuit chip that is stacked together with the first and second memory chips,
wherein the logic circuit includes a row decoder that provides operating voltages to a drain select line coupled to a gate of the drain select transistor, to a source select line coupled to a gate of the source select transistor and to a plurality of word lines coupled to gates of the plurality of memory cells,
wherein, in each of the plurality of memory blocks, a drain select line coupled to the first sub-block and a drain select line coupled to the second sub-block are separately provided with an operating voltage from the row decoder,
wherein, in each of the plurality of memory blocks, a source select line coupled to the first sub-block and a source select line coupled to the second sub-block are separately provided with an operating voltage from the row decoder, and
wherein, in each of the plurality of memory blocks, each one of a plurality of word lines coupled to the first sub-block corresponds to a different one of the plurality of word lines coupled to the second sub-block, and corresponding word line pairs are provided with the same operating voltage from the row decoder.

9. The semiconductor memory device according to claim 8,
wherein, in the erase operation, a drain select line and a source select line of a selected sub-block are floated after a ground voltage is applied,
wherein a drain select line and a source select line of an unselected sub-block of the first memory chip or the second memory chip that includes the selected sub-block are floated,
wherein a ground voltage is applied to a drain select line and a source select line of an unselected sub-block of the first memory chip or the second memory chip that does not include the selected sub-block,
wherein a ground voltage is applied to the plurality of word lines of the memory block that includes the selected sub-block, and
wherein the plurality of word lines of the memory block that does not include the selected sub-block are floated.

10. A semiconductor memory device comprising:
a plurality of planes, each defined in a first memory chip and a second memory chip that is stacked on the first memory chip in a stack direction,
wherein each of the plurality of planes includes a first sub-plane that includes a plurality of first sub-blocks disposed in the first memory chip and includes a second sub-plane that includes a plurality of second sub-blocks disposed in the second memory chip,
wherein, in each of the plurality of planes, each of a plurality of memory blocks includes one of the plurality of first sub-blocks and one of the plurality of second sub-blocks,
wherein an erase voltage is separately applied to each first sub-plane and second sub-plane in an erase operation, and the erase operation is performed in a sub-block, and
wherein the erase voltage is provided to a source plate and bit lines of a sub-plane that includes a selected sub-block, and a ground voltage is provided to a source plate and bit lines of a sub-plane that does not include the selected sub-block.

11. The semiconductor memory device according to claim 10, wherein a first sub-block and a second sub-block that configure a memory block are arranged in the stack direction.

12. The semiconductor memory device according to claim 10,
wherein each of the first and second sub-planes includes a coupling capacitor comprising a first electrode configured by a bit line, a second electrode configured by a wiring line and overlapping with the bit line, and an insulation layer disposed between the bit line and the wiring line and configured by a dielectric layer, and
wherein, in the erase operation, the erase voltage is applied to the wiring line of a sub-plane that includes a selected sub-block, and is provided to the bit line of the sub-plane that includes the selected sub-block.

13. The semiconductor memory device according to claim 10, wherein the erase voltage is provided to the source plate through a via that traverses the memory chip that includes the selected sub-block, and the ground voltage is provided to the source plate through a via that traverses the memory chip that does not include the selected sub-block.

14. The semiconductor memory device according to claim 10,
wherein each of the plurality of first and each of the plurality of second sub-blocks includes a plurality of cell strings, and
wherein each of the plurality of cell strings comprises:
a drain select transistor coupled to a bit line;
a source select transistor coupled to a source plate; and
a plurality of memory cells coupled between the drain select transistor and the source select transistor.

15. The semiconductor memory device according to claim 14, further comprising:
a logic circuit defined on a circuit chip that is stacked together with the first and second memory chips,
wherein the logic circuit includes a row decoder that provides operating voltages to a drain select line coupled to a gate of the drain select transistor, to a source select line coupled to a gate of the source select transistor and to a plurality of word lines coupled to gates of the plurality of memory cells,
wherein, in each of the plurality of memory blocks, a drain select line coupled to the first sub-block and a drain select line coupled to the second sub-block are separately provided with an operating voltage from the row decoder,
wherein, in each of the plurality of memory blocks, a source select line coupled to the first sub-block and a source select line coupled to the second sub-block are separately provided with an operating voltage from the row decoder, and
wherein, in each of the plurality of memory blocks, each one of a plurality of word lines coupled to the first sub-block corresponds to a different one of the plurality of word lines coupled to the second sub-block, and corresponding word lines pairs are provided with the same operating voltage from the row decoder.

16. The semiconductor memory device according to claim 15,
wherein, in the erase operation, a drain select line and a source select line of a selected sub-block are floated after a ground voltage is applied, wherein a drain select line and a source select line of an unselected sub-block of the sub-plane that includes the selected sub-block are floated, wherein a ground voltage is applied to a drain select line and a source select line of a sub-block of a sub-plane that does not include the selected sub-block, wherein a ground voltage is applied to the plurality of word lines of the memory block that includes the selected sub-block, and wherein the plurality of word lines of the memory block that does not include the selected sub-block are floated.

17. A semiconductor memory device comprising:
a plurality of first sub-blocks defined in a first memory chip including a first erase voltage pass unit; and
a plurality of second sub-blocks defined in a second memory chip, including a second erase voltage pass unit, that is stacked on the first memory chip in a stack direction,
wherein each of a plurality of memory blocks includes one of the plurality of first sub-blocks and one of the plurality of second sub-blocks, and
wherein the first erase voltage pass unit and the second erase voltage pass unit being coupled in common to a line to receive an erase voltage in an erase operation.

18. The semiconductor memory device according to claim 17, wherein the line is a through-chip via.

* * * * *